United States Patent
Shen et al.

(10) Patent No.: US 11,133,921 B1
(45) Date of Patent: Sep. 28, 2021

(54) HIGH-SPEED SYNCHRONIZER WITH LOWER METASTABILITY FAILURE RATE

(71) Applicant: Silicon Laboratories Inc., Austin, TX (US)

(72) Inventors: Linxiao Shen, Austin, TX (US); Thomas Saroshan David, Lakeway, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/942,484

(22) Filed: Jul. 29, 2020

(51) Int. Cl.
*H04L 7/00* (2006.01)

(52) U.S. Cl.
CPC .................. *H04L 7/0045* (2013.01)

(58) Field of Classification Search
CPC .... H04L 7/0045; H03K 3/0375; H03L 7/1976
USPC .......... 375/354, 355, 357, 371, 372
See application file for complete search history.

(56) References Cited

U.S. PATENT DOCUMENTS

| | | | |
|---|---|---|---|
| 7,928,768 B1* | 4/2011 | Pedersen | H03K 3/0375 326/94 |
| 2016/0226502 A1* | 8/2016 | Cali | H03L 7/1976 |

* cited by examiner

*Primary Examiner* — Phuong Phu
(74) *Attorney, Agent, or Firm* — Gary Stanford

(57) ABSTRACT

A data synchronizer including an input stage, a driver stage, and a keeper stage. The input stage latches input data to a data node in response to a first clock signal transition. The driver stage has an input coupled to the data node and has an output coupled to a gain node. The keeper stage latches data asserted on the gain node back to the input stage to maintain data on the data node in response to a second transition of the clock signal. The driver stage has an increased drive strength and a reduced loading capacitance to increase the gain-bandwidth product of the latch loop to reduce metastability. A flip-flop may be configured with input and output latches each including driver stages having increased drive strength and reduced loading capacitance to increase the gain-bandwidth product of each of the latch loops to reduce metastability.

20 Claims, 3 Drawing Sheets

HIGH-SPEED SYNCHRONIZER WITH LOWER METASTABILITY FAILURE RATE

BACKGROUND OF THE INVENTION

Field of the Invention

The present invention relates in general to data synchronizer circuits, and more particularly to a high-speed synchronizer latch circuit with a lower metastability failure rate.

Description of the Related Art

Data may be synchronized with a clock signal so that the captured data may be further processed by digital circuitry in an electronic circuit. Often, however, the data is asynchronous with respect to the clock edges which can result in metastability failure. Metastability problems can be eliminated by adding special structures known as synchronizers. A synchronizer allows sufficient time for the data to settle down and ensure a stable output.

A commonly used synchronizer is based on a flip-flop. Whenever there are setup or hold time violations in a flip-flop, it may enter a metastable state in which the output of the flip-flop is unpredictable. FIG. 1 is a schematic depiction illustrating a multiple flip-flop synchronizer 100 according to a conventional configuration which may be used to reduce or possibly eliminate metastability. The input data DIN is provided to a data (D) input of a first D-type flip-flop (DFF) 102, having its non-inverting Q output provided to a D input of a second DFF 104, having its Q output provided to a D input of a third DFF 106, having its Q output providing an output data signal DOUT. A clock signal CLK is provided to the clock input of each of the DFFs 102, 104, and 106. DIN is asynchronous with respect to CLK, so that if DIN violates the setup time violation or a hold time of the DFF 102, the Q output of the first DFF 102 may exhibit substantial metastability. The Q output of the first DFF 102 may thus have a metastable state shown as META.

In the conventional configuration, a common solution was to add additional flip-flop stages. Thus, the second DFF 104 forms a second stage that reduces metastability, and the third DFF 106 forms a third stage that reduces metastability even further so that DOUT at the output of DFF 106 exhibits significantly reduced metastability. Additional stages may be included, in which the metastability failure rate may be exponentially reduced as the number of flip-flop stages is increased. The synchronizer 100, which is implemented in accordance with conventional multi-flop synchronizers with multiple flip-flop stages, however, causes significant latency, consumes valuable silicon area, and substantially increases power consumption.

SUMMARY OF THE INVENTION

A data synchronizer according to one embodiment includes an input stage, a driver stage, and a keeper stage. The input stage latches input data from an input node to a data node in response to a clock signal transition from a first state to a second state. The driver stage has an input coupled to the data node and has an output coupled to a gain node. The keeper stage latches data asserted on the gain node back to the input stage to maintain data on the data node in response to a transition of the clock signal from the second state to the first state.

In one embodiment, the input stage includes a clocked first buffer having an input coupled to the input node, an output coupled to that data node, and a clock input receiving the clock signal. The driver stage includes a second buffer having a drive strength that is larger than a drive strength of the clocked first buffer and having a loading capacitance that is less than a loading capacitance of the keeper stage. The keeper stage includes a third buffer having an input coupled to the gain node, having an output coupled to the data node, and having an inverted clock input receiving the clock signal.

The input stage may include a clocked first inverter having an input coupled to the input node, having an output coupled to a feedback node, and having a clock input receiving the clock signal, and a second inverter having an input coupled to the feedback node and having an output coupled to the data node. The driver stage may include a first inverting buffer having an input coupled to the data node and having an output, and a second inverting buffer having an input coupled to the output of the first high gain inverting buffer and having an output coupled to the gain node. The first and second inverting buffers collectively have a drive strength that is greater than a drive strength of the second inverter. The keeper stage may include a clocked third inverter having an input coupled to the gain node, having an output coupled to the feedback node, and having an inverted clock input receiving the clock signal. The first inverting buffer may have a loading capacitance that is less than a loading capacitance of the clocked third inverter.

The data synchronizer may include PMOS and NMOS transistors. The sizes of the PMOS and NMOS transistors of the driver stage may be selected to increase a gain-bandwidth product of a latch loop between the input stage and the keeper stage to reduce metastability. The data synchronizer may include P-channel and N-channel transistors. The transistors of the driver stage may have larger drive strength with reduced loading capacitance as compared to the transistors of the other stages. The transistors of the driver stage may be selected to increase a gain-bandwidth product of a latch loop between the input stage and the keeper stage to reduce metastability.

A flip-flop according to one embodiment may include an input latch and an output latch. The input latch may include an input stage, a first driver stage, and a keeper stage. The output latch may include a feed forward stage, a second driver stage, and an output stage. The first and second driver stages are provided in the latch loops of the input and output latches, respectively. The first driver stage may be configured to increase a gain-bandwidth product of a first latch loop between the input stage and the keeper stage, and the second driver stage may be configured to increase a gain-bandwidth product of a second latch loop between the feed forward stage and the output stage. The first and second driver stages may be each be configured with a drive strength and a loading capacitance that reduces metastability. The first and second driver stages may be made with devices having greater drive capacity and reduced loading capacitance as compared to the input, keeper, feed-forward, and output stages.

A method of synchronizing data may include providing a first latch that latches data from an input node to a data node in response to a first transition of a clock signal including providing a first latch loop for maintaining the data node, providing a second latch that latches data from that data node to an output node in response to a second transition of a clock signal including providing a second latch loop for maintaining the output node, providing a first driver stage within the first latch loop, and providing a second driver stage within the second latch loop.

The method may include providing the first driver stage to increase a gain-bandwidth product of the first latch loop and providing the second driver stage to increase a gain-bandwidth product of a second latch loop. The method may include configuring the first and second drive stages with drive capacity and loading capacitance that reduces metastability.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The proposed latch structure addresses the metastability problem with reduced latency, silicon area, and power consumption. The synchronizing latch structure may be used to construct a D-type flip-flop (DFF) which also exhibits reduced latency, silicon area, and power consumption as compared to conventional multi-flop synchronizers. A relatively large buffer device having a relatively large drive strength and reduced loading capacitance is inserted within the latch loop. In this manner, the added buffer devices increase the loop gain-bandwidth product of the latch loop of each latch of a DFF, so that each latch, and hence the DFF as a whole, can resolve metastability much faster. The buffer devices boost the loop gain by a significant amount while only contributing high-frequency poles. In this manner, the loop gain-bandwidth product of each latch can be extended significantly, leading to a faster resolving time and thus lower metastability failure rate of the DFF.

Figure 2:
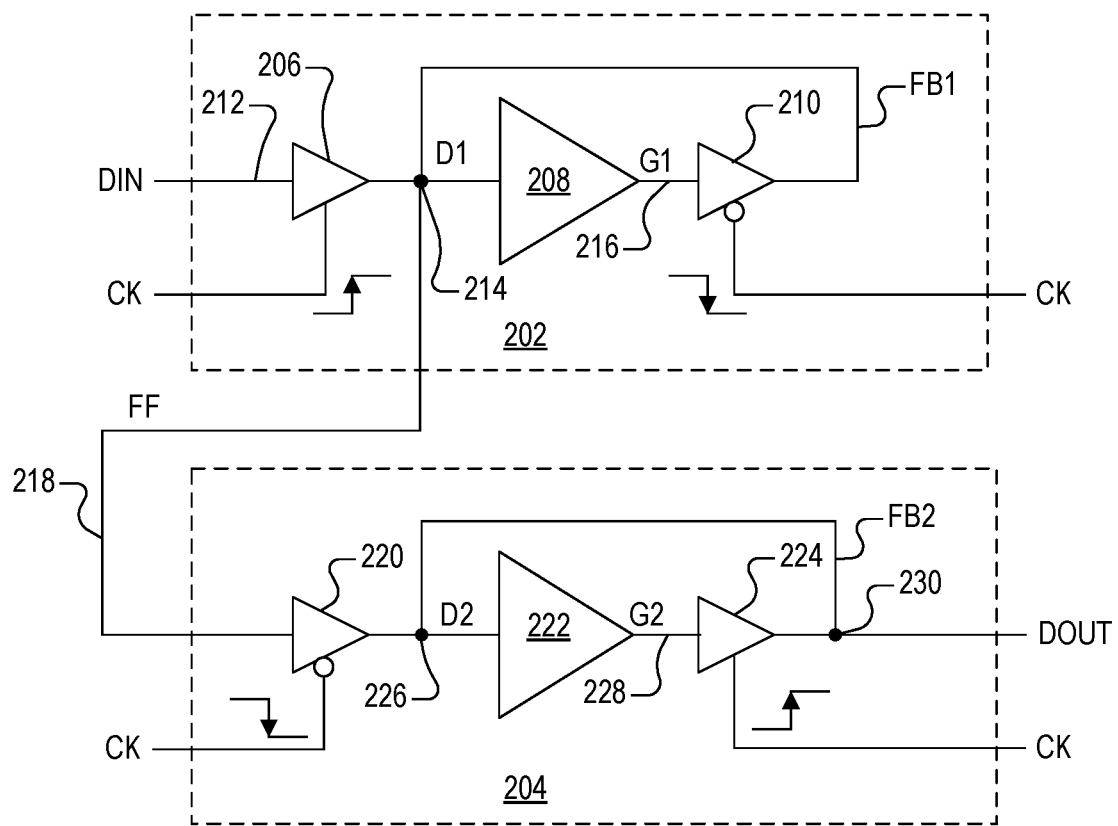
FIG. 2 is a simplified schematic diagram of a D-type flip-flop (DFF) including synchronizing input and output latches implemented according to one embodiment of the present disclosure.

FIG. 2 is a simplified schematic diagram of a D-type flip-flop (DFF) 200 including synchronizing input and output latches 202 and 204 implemented according to one embodiment of the present disclosure. The synchronizing latches 202 and 204 enable the DFF 200 to be used as a data synchronizer for synchronizing a binary or digital input data signal DIN relative a clock signal CK. The input latch 202 receives DIN and the output latch 204 provides a synchronized output signal DOUT. DIN is latched by the input latch 202 and provided to an input of the output latch 204 when CK is in a second binary state after transitioning from a first binary state, which is then latched into the output latch 204 when CK transitions back to the first binary state. The latched data is held as the output DOUT after CK next transitions back to the second logic state.

In the illustrated embodiment, the first binary state is a logic low value or binary "0" having a low voltage value, and the second binary state is logic high value or binary "1" having a high voltage value. Thus, DIN is latched into the input latch 202 when CK goes high, and is latched into the output latch 204 when CK next goes low. It is appreciated that the logic states of CK may be reversed without departing from the spirit and scope of the present disclosure.

The input latch 202 includes a clocked input buffer 206 receiving CK, a driver buffer 208, and a clocked keeper buffer 210 receiving CK at an inverted clock input. DIN is received at an input node 212 coupled to an input of the clocked input buffer 206, which has an output coupled to a first data node 214 providing a first data signal D1. The input buffer 206 may be thought of as a level-sensitive pass gate which is closed when CK is low and open when CK is high. The digital or binary value of DIN is thus passed or transferred by the clocked input buffer 206 to the first data node 214 as D1 after CK goes high. The driver buffer 208 receives D1 on the first data node 214 and outputs a first "gain" signal G1 on a gain node 216.

The clocked keeper buffer 210 has an input coupled to the first gain node 216 receiving G1 and has an output coupled via a feedback conductor FB1 to the first data node 214 developing D1. The clocked keeper buffer 210 may also be thought of as a level-sensitive pass gate which is closed when CK is high and open when CK is low. Thus, when CK is high, the keeper buffer 210 buffer is closed so that the input buffer 206 can begin driving D1 on node 214 to the level of DIN. When CK next goes low, the input buffer 206 closes and the keeper buffer 210 opens to receive and buffer G1 to "keep" or hold the value of D1 during the current clock cycle.

The output latch 204 is configured in a substantially similar manner as the input latch 202 but operates with opposite levels of CK. The output latch 204 includes a clocked input buffer 220 receiving CK at an inverted clock input, a driver buffer 222, and a clocked keeper buffer 224 receiving CK at a non-inverted clock input. The input buffer 220 may be thought of as a level-sensitive pass gate which is closed when CK is high and open when CK is low. The keeper buffer 224 may also be thought of as a level-sensitive pass gate which is open when CK is high and closed when CK is low. A feed-forward conductor 218 conveys the first data signal D1 as a feed-forward signal FF provided to an input of the clocked input buffer 220, which has an output coupled to a second data node 226 developing a second data signal D2. The driver buffer 222 receives D2 on the second data node 226 and outputs a second gain signal G2 on a second gain node 228. The keeper buffer 224 receives G2 at its output and has its output coupled to an output node 230 developing the output signal DOUT. A feedback conductor FB2 couples the output node 230 back to the second data node 226.

When CK goes low, the input buffer 220 of the output latch 204 opens and passes D1 onto node 226 as D2. The driver buffer 220 begins driving G2 onto node 228 to the level of D2. The keeper buffer 224 of the output latch 204 is closed while CK is low. Since the keeper buffer 224 is closed while CK is low, the input buffer 220 also begins driving DOUT on the output node 230 to the level of D2 via the feedback conductor FB2. When CK next goes high, the input buffer 220 closes and the keeper buffer 224 opens to receive and buffer G2 to hold the value of D2 and to drive DOUT to the level of D2 during the current clock cycle.

Since DIN is asynchronous with respect to CK, DIN may not be stable or may be changing during transitions of CK.

Figure 1:
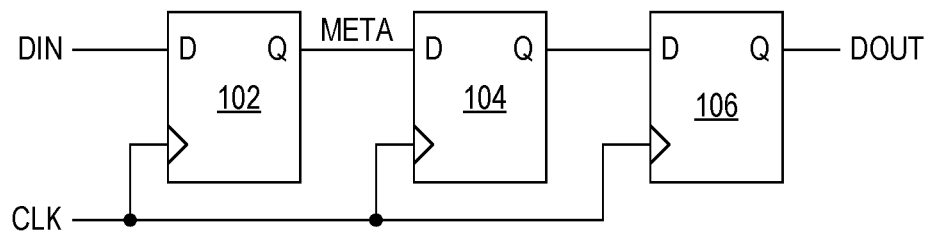
FIG. 1 is a schematic depiction illustrating a multiple flip-flop synchronizer according to a conventional configuration.

Thus, DIN may transition very close to or even after CK transitions high, potentially causing a metastable state. A conventional DFF, such as any of the DFFs 102, 104, and 106 of FIG. 1, does not include the driver buffers 208 and 222 coupled into the latch loops of the input and output latches 202 and 204. The metastable state, therefore could be propagated through the intermediate nodes and to the output DOUT, such as shown by the META signal at the output of the DFF 102.

The driver buffers 208 and 222 are shown as larger buffer devices to emphasize having a larger drive strength and reduced loading capacitance as compared to the other buffers 206, 210, 220, and 224 of the DFF 200. In this manner, the driver buffers 208 and 222 increase the loop gain-bandwidth product of the latch loop of each of the latches 202 and 204, so that the latches 202 and 204, and hence the DFF 200 as a whole, can resolve the metastability faster. The driver buffers 208 and 222 boost the gain by a significant amount while only contributing high-frequency poles. In this manner, the loop gain-bandwidth product of each latch 202 and 204 can be extended significantly, leading to a faster resolving time and thus lower metastability failure rate of the DFF 200.

When compared to the cascading DFF-based structure of the multiple flip-flop synchronizer 100, the DFF 200 only includes larger buffer devices in the latch loops which results in a significantly smaller increase in the total silicon area. The DFF 200 is only slightly larger than the DFF 102 and thus much smaller than the combined size of the DFFs 102, 104 and 106. Compared with the multiple flip-flop synchronizer 100, the proposed structure of the latches 202 and 204 of the DFF 200 saves a significant amount of silicon area, does not add significant delay, and consumes substantially less power.

Figure 3:
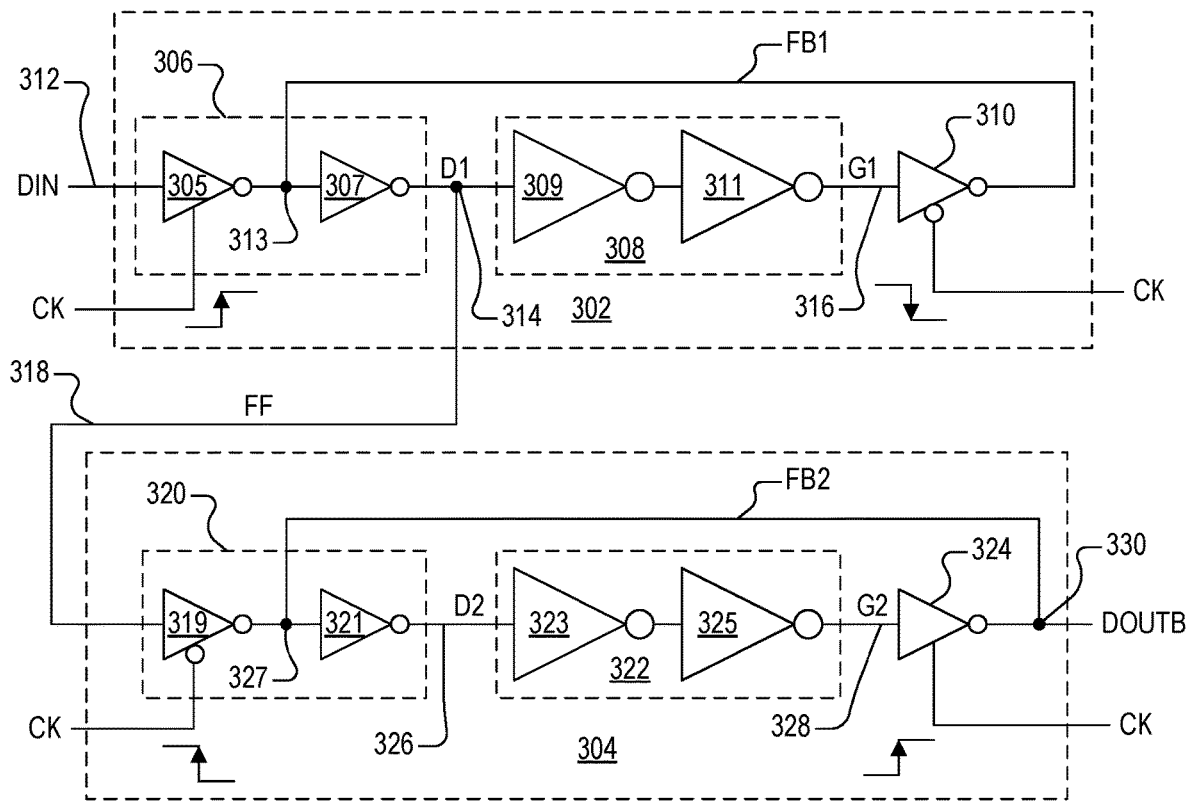
FIG. 3 is a simplified logic diagram of another DFF including synchronizing input and output latches implemented according to another embodiment of the present disclosure.

FIG. 3 is a simplified logic diagram of a DFF 300 including synchronizing input and output latches 302 and 304 implemented according to another embodiment of the present disclosure. The synchronizing latches 302 and 304 enable the DFF 300 to also be used data synchronizer for synchronizing DIN relative to CK. The input latch 302 receives the input data signal DIN and the output latch 304 provides an inverted output signal DOUTB, in which DOUTB is an inverted version of output data signal DOUT. It is noted that a signal name with a "B" appended at the end denotes binary inversion unless otherwise specified. DIN is latched by the input latch 302 and provided to an input of the output latch 304 when CK goes high, and is then latched into the output latch 304 when CK next goes low.

The input latch 302 includes a clocked input buffer 306 receiving CK, a driver buffer 308, and a clocked keeper buffer 310 receiving CK at an inverted clock input. DIN is received at an input node 312 coupled to an input of the clocked input buffer 306, which has an output coupled to a first data node 314 providing a first data signal D1. The input buffer 306 may be thought of as a level-sensitive pass gate which is closed when CK is low and open when CK is high. The digital or binary value of DIN is thus passed or transferred by the clocked input buffer 306 to the first data node 314 as D1 after CK goes high. The driver buffer 308 receives D1 on the first data node 314 and outputs a first gain signal G1 on a gain node 316.

The clocked keeper buffer 310 has an input coupled to the first gain node 316 receiving G1 and has an output coupled via a feedback conductor FB1 to the input buffer 306. The clocked keeper buffer 310 may also be thought of as a level-sensitive pass gate which is closed when CK is high and open when CK is low. Thus, when CK is high, the keeper buffer 310 buffer is closed so that the input buffer 306 can begin driving D1 on node 314 to the level of DIN. When CK next goes low, the input buffer 306 closes and the keeper buffer 310 opens to receive, buffer and invert G1 to hold the value of D1 during the current clock cycle.

The output latch 304 is configured in a substantially similar manner as the input latch 302 but operates with opposite levels of CK. The output latch 304 includes a clocked input buffer 320 receiving CK at an inverted clock input, a driver buffer 322, and a clocked keeper buffer 324 receiving CK at a non-inverted clock input. The input buffer 320 may be thought of as a level-sensitive pass gate which is closed when CK is high and open when CK is low. The keeper buffer 324 may also be thought of as a level-sensitive pass gate which is open when CK is high and closed when CK is low. A feed-forward conductor 318 conveys the first data signal D1 as a feed-forward signal FF provided to an input of the clocked input buffer 320, which has an output coupled to a second data node 326 developing a second data signal D2. The driver buffer 322 receives D2 on the second data node 326 and outputs a second gain signal G2 on a second gain node 328. The keeper buffer 324 receives G2 at its output and has its output coupled to an output node 330 developing the output signal DOUTB. A feedback conductor FB2 couples the output node 330 back to the second data node 326.

When CK goes low, the input buffer 320 of the output latch 304 opens and passes D1 onto node 326 as D2. The driver buffer 320 begins driving G2 on node 328 to the level of D2. The keeper buffer 324 of the output latch 304 is closed while CK is low. Since the keeper buffer 324 is closed while CK is low, the input buffer 320 also begins driving DOUT on the output node 330 to the level of D2 via the feedback conductor FB2. When CK next goes high, the input buffer 320 closes and the keeper buffer 324 opens to receive, buffer and invert G2 to hold the value of D2 and to drive DOUTB to the level of D2 during the current clock cycle.

A difference between the DFF 200 and the DFF 300 is the use of inverters or inverting buffers. The clocked input buffer 306 includes a clocked inverter 305 and another inverter 307. The clocked inverter 305 has an input coupled to the input node 312, an output coupled to an intermediate node 313, and a clock input receiving CK. Thus, when CK goes high, an inverted version of DIN passes to the intermediate node 313, which is inverted again by the inverter 307 to provide D1 on the first data node 314. The driver buffer 308 includes a first inverting driver buffer 309 followed by a second inverting driver buffer 311, in which the inverting driver buffer 309 has its input coupled to node 314 and its output coupled to the input of the inverting driver buffer 311, having its output coupled to the gain node 316. The clocked keeper buffer 310 is an inverting buffer having its output coupled to the intermediate node 313 via the feedback conductor FB1.

The clocked input buffer 320 includes a clocked inverter 319 and another inverter 321. The clocked inverter 319 has an input coupled to the conductor 318, an output coupled to an intermediate node 327, and an inverting clock input receiving CK. Thus, when CK goes low, an inverted version of FF passes to the intermediate node 327, which is inverted again by the inverter 321 to provide D1 on the first data node 326. The driver buffer 322 includes a first inverting driver buffer 323 and a second inverting driver buffer 325, in which the inverting driver buffer 323 has its input coupled to node 326 and its output coupled to the input of the inverting driver buffer 325, having its output coupled to the gain node 328.

The clocked keeper buffer 324 is an inverting buffer having its output coupled to the intermediate node 327 via the feedback conductor FB2.

Since DIN is asynchronous with respect to CK, DIN may not be stable or may be changing during transitions of CK. Thus, DIN may transition very close to or even after CK transitions high, potentially causing a metastable state. A conventional DFF does not include the driver buffers 308 and 322 coupled into the latch loops of the input and output latches 302 and 304. The metastable state, therefore could be propagated through the intermediate nodes and to the output DOUTB.

The inverting driver buffers 309 and 311 of the driver buffer 308 and the inverting driver buffers 323 and 325 of the driver buffer 322 are shown as larger inverting devices to emphasize having a larger drive strength and reduced loading capacitance as compared to the other inverters of the DFF 300. In this manner, the driver buffers 308 and 322 increase the loop gain-bandwidth product of the latch loop of each of the latches 302 and 304, so that the latches 302 and 304, and hence the DFF 300 as a whole, can resolve the metastability faster. The driver buffers 308 and 322 boost the gain by a significant amount while only contributing high-frequency poles. In this manner, the loop gain-bandwidth product of each latch can be extended significantly, leading to a faster resolving time and thus lower metastability failure rate of the DFF 300.

When compared to the cascading DFF-based structure of the multiple flip-flop synchronizer 100, the DFF 300 only includes larger buffer devices in the latch loops which results in a significantly smaller increase in the total silicon area. The DFF 300 is only slightly larger than the DFF 102 and thus much smaller than the combined size of the DFFs 102, 104 and 106. Compared with the multiple flip-flop synchronizer 100, the proposed structure of the latches 302 and 304 of the DFF 300 saves a significant amount of silicon area, does not add significant delay, and consumes substantially less power.

Figure 4:
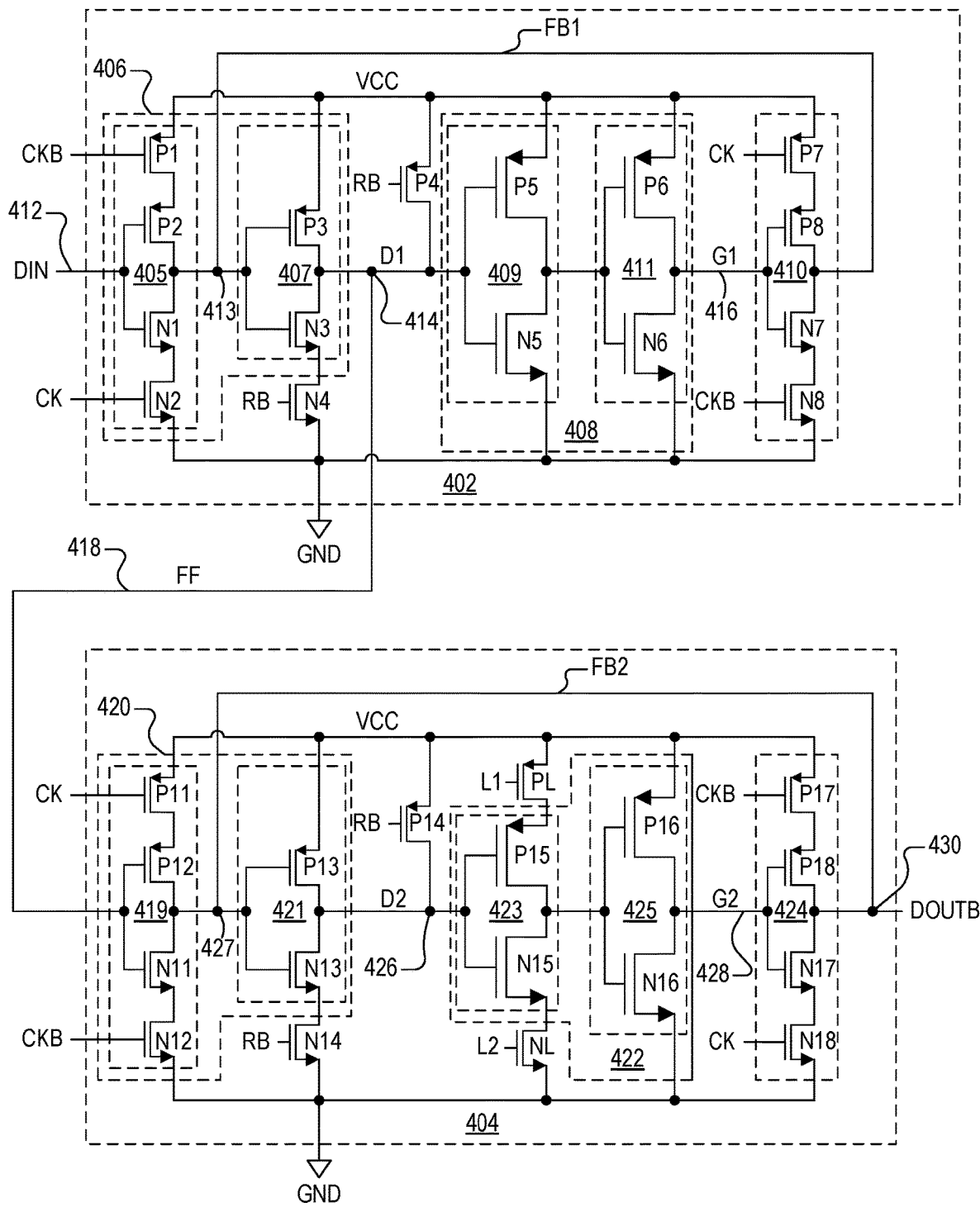
FIG. 4 is a simplified schematic diagram of another DFF including synchronizing input and output latches according to another embodiment of the present disclosure.

FIG. 4 is a simplified schematic diagram of a DFF 400 including synchronizing input and output latches 402 and 404 implemented according to another embodiment of the present disclosure. The synchronizing latches 402 and 404 enable the DFF 400 to also be used data synchronizer for synchronizing DIN relative to CK. The input latch 402 receives the input data signal DIN and the output latch 404 provides the inverted output signal DOUTB. DIN is latched by the input latch 402 and provided to an input of the output latch 404 when CK goes high, and is then latched into the output latch 404 when CK next goes low.

The input latch 402 includes a clocked input buffer 406 receiving CK and an inverted clock signal CKB, a driver buffer 408, and a clocked keeper buffer 410 receiving CK and CKB, in which CKB is an inverted version of CK. DIN is received at an input node 412 coupled to an input of the clocked input buffer 406, which has an output coupled to a first data node 414 providing a first data signal D1. The input buffer 406 may be thought of as a level-sensitive pass gate which is closed when CK is low and open when CK is high. The digital or binary value of DIN is thus passed or transferred by the clocked input buffer 406 to the first data node 414 as D1 after CK goes high. The driver buffer 408 receives D1 on the first data node 414 and outputs a first gain signal G1 on a gain node 416.

The clocked keeper buffer 410 has an input coupled to the first gain node 416 receiving G1 and has an output coupled via a feedback conductor FB1 to the clocked input buffer 406. The clocked keeper buffer 410 may also be thought of as a level-sensitive pass gate which is closed when CK is high and open when CK is low. Thus, when CK is high, the keeper buffer 410 buffer is closed so that the input buffer 406 can begin driving D1 on node 414 to the level of DIN. When CK next goes low, the input buffer 406 closes and the keeper buffer 410 opens to hold the value of D1 during the current clock cycle.

The output latch 404 is configured in a substantially similar manner as the input latch 402 but operates with opposite levels of CK. The output latch 404 includes a clocked input buffer 420 receiving CK and CKB, a driver buffer 422, and a clocked keeper buffer 424 also receiving both CK and CKB. The input buffer 420 may be thought of as a level-sensitive pass gate which is closed when CK is high (and CKB is low) and open when CK is low (and CKB is high). The keeper buffer 424 may also be thought of as a level-sensitive pass gate which is open when CK is high and closed when CK is low. A feed-forward conductor 418 conveys the first data signal D1 as a feed-forward signal FF provided to an input of the clocked input buffer 420, which has an output coupled to a second data node 426 developing a second data signal D2. The driver buffer 422 receives D2 on the second data node 426 and outputs a second gain signal G2 on a second gain node 428. The keeper buffer 424 receives G2 at its output and has its output coupled to an output node 430 developing the output signal DOUTB. A feedback conductor FB2 couples the output node 430 back to the clocked input buffer.

When CK goes low, the input buffer 420 of the output latch 404 opens and passes D1 onto node 426 as D2. The driver buffer 420 begins driving G2 on node 428 to the level of D2. The keeper buffer 424 of the output latch 404 is closed while CK is low. Since the keeper buffer 424 is closed while CK is low, the input buffer 420 also begins driving DOUTB on the output node 430 to the level of D2 via the feedback conductor FB2. When CK next goes high, the input buffer 420 closes and the keeper buffer 424 opens to hold the value of D2 and to drive DOUTB to the level of D2 during the current clock cycle.

In a similar manner as described for the DFF 300, the clocked input buffer 406 includes a clocked inverter 405 and another inverter 407. The clocked inverter 405 has an input coupled to the input node 412, an output coupled to an intermediate node 413, and clock inputs receiving CK and CKB. Thus, when CK goes high, an inverted version of DIN passes to the intermediate node 413, which is inverted again by the inverter 407 to provide D1 on the first data node 414. The driver buffer 408 includes a first inverting driver buffer 409 followed by a second inverting driver buffer 411, in which the inverting driver buffer 409 has its input coupled to node 414 and its output coupled to the input of the inverting driver buffer 411, having its output coupled to the gain node 416. The clocked keeper buffer 410 is an inverting buffer having its output coupled to the intermediate node 413 via the feedback conductor FB1.

The clocked input buffer 420 includes a clocked inverter 419 and another inverter 421. The clocked inverter 419 has an input coupled to the conductor 418, an output coupled to an intermediate node 427, and clock inputs receiving CK and CKB. Thus, when CK goes low, an inverted version of FF passes to the intermediate node 427, which is inverted again by the inverter 421 to provide D1 on the first data node 426. The driver buffer 422 includes a first inverting driver buffer 423 followed by a second inverting driver buffer 425, in which the inverting driver buffer 423 has its input coupled to node 426 and its output coupled to the input of the inverting driver buffer 425, having its output coupled to the gain node 428. The clocked keeper buffer 424 is an inverting buffer having its output coupled to the intermediate node 427 via the feedback conductor FB2.

The input latch 402 and the output latch 404 of the DFF 400 may be implemented in complementary MOS (CMOS) using P-channel MOS (PMOS) devices and N-channel MOS (NMOS) transistor devices or the like as shown. Although MOS transistors are shown and described, it is understood that alternative types of transistors may also be used. Each transistor includes a pair of current terminals (e.g., drain and source, collector and emitter, etc.) and a control terminal (e.g., gate, base, etc.).

The clocked inverter 405 includes PMOS transistors P1 and P2 and NMOS transistors N1 and N2. P1 has its source terminal coupled to a supply voltage VCC, its gate terminal receiving CKB, and its drain terminal coupled to the source terminal of P2. The gate terminals of P2 and N1 are coupled together at node 412, and the drain terminals of P2 and N1 are coupled together at the intermediate node 413. N1 has its source terminal coupled to the drain terminal of N2, the gate terminal of N2 receives CK, and the source terminal of N2 is coupled to a supply reference node, such as ground (GND).

The inverter 407 is shown including a PMOS transistor P3 and an NMOS transistor N3. P3 has its source terminal coupled to VCC, its gate terminal coupled to node 413, and its drain terminal coupled to node 414. N3 has its drain terminal coupled to node 414, its gate terminal coupled to node 413, and its drain terminal coupled to the drain terminal of another NMOS transistor N4. The gate terminal of N4 receives a bias voltage RB, and its source terminal is coupled to GND. The voltage of RB may be set to a value so that N4 serves as a pull-down resistance. A PMOS transistor P4 has its source terminal coupled to VCC, its drain terminal coupled to node 414, and its gate terminal receiving RB, so that P4 may serve as a pull-up resistance.

The first inverting driver buffer 409 includes a PMOS transistor P5 and an NMOS transistor N5. The source terminal of P5 is coupled to VCC, the gate terminal of P5 is coupled to node 414, and the drain terminal of P5 is coupled to the drain terminal of N5. The gate terminal of N5 is coupled to node 414, and its source terminal is coupled to GND. Similarly, the second inverting driver buffer 411 includes a PMOS transistor P6 and an NMOS transistor N6. The source terminal of P6 is coupled to VCC, the gate terminal of P6 is coupled to the gate terminal of N6, and the drain terminal of P6 is coupled to the drain terminal of N6 at node 416. The source terminal of N6 is coupled to GND.

The clocked keeper buffer 410 includes PMOS transistors P7 and P8 and NMOS transistors N7 and N8. P7 has its source terminal coupled to VCC, its gate terminal receiving CK, and its drain terminal coupled to the source terminal of P8. The gate terminals of P8 and N7 are coupled together at node 416, and the drain terminals of P8 and N7 are coupled together at the conductor FB1 further coupled to node 413. N7 has its source terminal coupled to the drain terminal of N8, the gate terminal of N8 receives CKB, and the source terminal of N8 is coupled to GND.

The clocked inverter 420 includes PMOS transistors P11 and P12 and NMOS transistors N11 and N12. P11 has its source terminal coupled to a supply voltage VCC, its gate terminal receiving CK, and its drain terminal coupled to the source terminal of P12. The gate terminals of P12 and N11 are coupled together at the conductor 418 (receiving FF), and the drain terminals of P12 and N11 are coupled together at the intermediate node 427. N11 has its source terminal coupled to the drain terminal of N12, the gate terminal of N12 receives CKB, and the source terminal of N12 is coupled to GND.

The inverter 421 includes a PMOS transistor P13 and an NMOS transistor N13. P13 has its source terminal coupled to VCC, its gate terminal coupled to node 427, and its drain terminal coupled to node 426. N13 has its drain terminal coupled to node 426, its gate terminal coupled to node 427, and its drain terminal coupled to the drain terminal of another NMOS transistor N14. The gate terminal of N14 receives RB, and its source terminal is coupled to GND. As previously described, the voltage of RB may be set to a value so that N14 serves as a pull-down resistance. A PMOS transistor P14 has its source terminal coupled to VCC, its drain terminal coupled to node 426, and its gate terminal receiving RB, so that P14 may serve as a pull-up resistance.

It is noted that an additional PMOS transistor PL and an additional NMOS transistor NL may be included, in which PL has its source terminal coupled to VCC and its gate terminal receiving a first load signal L1, and in which NL has its source terminal coupled to GND and its gate terminal receiving a second load signal L2. PL and NL are not part of the inverting drive buffer 423 or the drive buffer 422 but may be used to load data from a retention latch (not shown or described).

The first inverting driver buffer 423 includes a PMOS transistor P15 and an NMOS transistor N15. The source terminal of P15 is coupled to the drain terminal of PL, the gate terminal of P15 is coupled to node 426, and the drain terminal of P15 is coupled to the drain terminal of N15. The gate terminal of N15 is coupled to node 426, and its source terminal is coupled to the drain terminal of NL. The second inverting driver buffer 425 includes a PMOS transistor P16 and an NMOS transistor N16. The source terminal of P16 is coupled to VCC, the gate terminal of P16 is coupled to the gate terminal of N16, and the drain terminal of P16 is coupled to the drain terminal of N16 at node 428. The source terminal of N16 is coupled to GND.

The clocked keeper buffer 424 includes PMOS transistors P17 and P18 and NMOS transistors N17 and N18. P17 has its source terminal coupled to VCC, its gate terminal receiving CKB, and its drain terminal coupled to the source terminal of P18. The gate terminals of P18 and N17 are coupled together at node 428, and the drain terminals of P18 and N17 are coupled together at the output node 430 which is further coupled via conductor FB2 to node 427. N17 has its source terminal coupled to the drain terminal of N18, the gate terminal of N18 receives CK, and the source terminal of N18 is coupled to GND.

Operation of the DFF 400 is similar to operation of the DFF 300. When CK goes high and CKB goes low, the clocked inverter 405 turns on so that the intermediate node 413 is driven to the value of DIN, which is inverted by the inverter 407 to drive node 426 to the value of DIN. The inverting driving buffers 409 and 411 drive the value of D1 to G1. The clocked keeper buffer 410 is turned off while CK is high and CKB is low. The value of D1 is also fed as FF to the input of the clocked inverting buffer 419, which is off while CK is high and CKB is low. When CK next goes low and CKB goes high, the clocked keeper buffer 410 turns on to hold the value of node 413 and thus D1, and the clocked inverter 419 turns on to pass D1 onto node 427. The inverter 421 inverts D1 to drive D2 onto node 426, and the inverting driving buffers 423 and 425 drive the value of D1 to G1. The clocked keeper buffer 424 is turned off while CK is low and CKB is high. When CK next goes high and CKB goes low, the clocked keeper buffer 424 turns on to hold the values of the DOUTB at the output node 430, and to hold the value of D2 on node 426.

Since DIN is asynchronous with respect to CK, DIN may not be stable or may be changing during transitions of CK. Thus, DIN may transition very close to or even after CK transitions high, potentially causing a metastable state. A conventional DFF does not include the driver buffers 408 and 422 coupled into the latch loops of the input and output latches 402 and 404. The metastable state, therefore could be propagated through the intermediate nodes and to the output DOUTB.

The MOS transistors P5, P6, N5, and N6 of the drive buffer 408 and the MOS transistors P15, P16, N15 and N16 of the driver buffer 422 are shown as larger MOS devices having a larger drive strength and reduced loading capacitance as compared to the other MOS devices of the DFF 400. In this manner, the driver buffers 408 and 422 increase the loop gain-bandwidth product of the latch loops so that the latches 402 and 404, and hence the DFF 400 as a whole, can resolve the metastability faster. The driver buffers 408 and 422 boost the gain by a significant amount while only contributing high-frequency poles. In this manner, the loop gain-bandwidth product of each latch can be extended significantly, leading to a faster resolving time and thus lower metastability failure rate of the DFF 400.

When compared to the cascading DFF-based structure of the multiple flip-flop synchronizer 100, the DFF 400 only includes larger MOS devices in the latch loops which results in a significantly smaller increase in the total silicon area. The DFF 400 is only slightly larger than the DFF 102 and thus much smaller than the combined size of the DFFs 102, 104 and 106. Compared with the multiple flip-flop synchronizer 100, the proposed structure of the latches 402 and 404 of the DFF 400 saves a significant amount of silicon area, does not add significant delay, and consumes substantially less power.

The input and output latches 202 and 204, 302 and 304, and 402 and 404 of the DFFs 200, 300 and 400, respectively, each include driver buffers in the latch loop that increase driving strength and reduce load capacitance to increase the gain-bandwidth product of the latch. The particular amount of increase of the gain-bandwidth product depends on the detailed layout implementation of a particular configuration. Nonetheless, for any given configuration, empirical measurements may be made and information may be obtained to determine the level of increase of the gain-bandwidth product to minimize or eliminate metastability for that configuration. In one particular embodiment, for example, the gain was boosted from about 47 decibels (dB) to over 70 dB and the bandwidth was boosted from about 290 Megahertz (MHz) to about 518 MHz. These numbers are exemplary only and results will vary from one configuration to the next. In any event, the metastability failure rate was significantly reduced.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A data synchronizer, comprising:
an input stage that latches input data from an input node to a data node in response to a clock signal transition from a first state to a second state;
a driver stage having an input coupled to the data node and having an output coupled to a gain node; and
a keeper stage that latches data asserted on the gain node back to the input stage to maintain data on the data node in response to a transition of the clock signal from the second state to the first state.

2. The data synchronizer of claim 1, wherein:
the input stage comprises a clocked first buffer having an input coupled to the input node, having an output coupled to the data node, and having a clock input receiving the clock signal;
wherein the driver stage comprises a second buffer having a drive strength that is larger than a drive strength of the clocked first buffer and having a loading capacitance that is less than a loading capacitance of the keeper stage; and
wherein the keeper stage comprises a third buffer having an input coupled to the gain node, having an output coupled to the data node, and having an inverted clock input receiving the clock signal.

3. The data synchronizer of claim 1, wherein the input stage comprises:
a clocked first inverter having an input coupled to the input node, having an output coupled to a feedback node, and having a clock input receiving the clock signal; and
a second inverter having an input coupled to the feedback node and having an output coupled to the data node.

4. The data synchronizer of claim 3, wherein the driver stage comprises:
a first inverting buffer having an input coupled to the data node and having an output;
a second inverting buffer having an input coupled to the output of the first high gain inverting buffer and having an output coupled to the gain node; and
wherein the first and second inverting buffers collectively have a drive strength that is greater than a drive strength of the second inverter.

5. The data synchronizer of claim 4, wherein the keeper stage comprises a clocked third inverter having an input coupled to the gain node, having an output coupled to the feedback node, and having an inverted clock input receiving the clock signal.

6. The data synchronizer of claim 5, wherein the first inverting buffer has a loading capacitance that is less than a loading capacitance of the clocked third inverter.

7. The data synchronizer of claim 1, wherein the driver stage comprises:
a first PMOS transistor having a source terminal coupled to a supply voltage node, having a gate terminal coupled to the data node, and having a drain terminal coupled to an intermediate node;
a first NMOS transistor having a drain node coupled to the intermediate node, having a gate terminal coupled to the data node, and having a source terminal coupled to a supply reference node;
a second PMOS transistor having a source terminal coupled to the supply voltage node, having a gate terminal coupled to the intermediate node, and having a drain terminal coupled to the gain node; and a second PMOS transistor having a drain node coupled to the gain node, having a gate terminal coupled to the intermediate node, and having a source terminal coupled to the supply reference node.

8. The data synchronizer of claim 7, wherein sizes of the first and second PMOS transistors and the first and second NMOS transistors are selected to increase a gain-bandwidth product of a latch loop between the input stage and the keeper stage to reduce metastability.

9. The data synchronizer of claim 1, wherein the input stage comprises:
first and second P-channel transistors having current terminals coupled in series between a supply voltage and a first intermediate node, having a first control terminal receiving an inverted clock signal, and having a second control terminal coupled to the input node;
first and second N-channel transistors having current terminals coupled in series between the first intermediate node and a reference voltage, having a first control terminal coupled to the input node, and having a second control terminal receiving the clock signal;
a third P-channel transistor having current terminals coupled between the supply voltage and the data node and having a control terminal coupled to the first intermediate node; and
a third N-channel transistor having current terminals coupled between the data node and the reference voltage and having a control terminal coupled to the first intermediate node.

10. The data synchronizer of claim 9, wherein the driver stage comprises:
a first inverting buffer, comprising:
a fourth P-channel transistor having current terminals coupled between the supply voltage and a second intermediate node and having a control terminal coupled to the data node; and
a fourth N-channel transistor having current terminals coupled between the second intermediate node and the reference voltage and having a control terminal coupled to the data node; and
a second inverting buffer, comprising:
a fifth P-channel transistor having current terminals coupled between the supply voltage and the gain node and having a control terminal coupled to the second intermediate node; and
a fifth N-channel transistor having current terminals coupled between the gain node and the reference voltage and having a control terminal coupled to the second intermediate node.

11. The data synchronizer of claim 10, wherein the fourth and fifth P-channel transistors and the fourth and fifth N-channel transistors have larger drive strength with reduced loading capacitance as compared to the first, second, and third P-channel and the first, second, and third N-channel transistors.

12. The data synchronizer of claim 10, wherein sizes of the fourth and fifth P-channel transistors and the fourth and fifth N-channel transistors are selected to increase a gain-bandwidth product of a latch loop between the input stage and the keeper stage to reduce metastability.

13. The data synchronizer of claim 10, wherein the keeper stage comprises:
sixth and seventh P-channel transistors having current terminals coupled in series between the supply voltage and the first intermediate node, having a first control terminal receiving the clock signal, and having a second control terminal coupled to the gain node; and
sixth and seventh N-channel transistors having current terminals coupled in series between the output node and a reference voltage, having a first control terminal coupled to the gain node, and having a second control terminal receiving the inverted clock signal.

14. A flip-flop, comprising:
an input latch, comprising:
an input stage that latches input data from an input node to a data node in response to a clock signal transition from a first state to a second state;
a first driver stage having an input coupled to the data node and having an output coupled to a gain node; and
a keeper stage that latches data asserted on the gain node back to the input stage to maintain data on the data node in response to a transition of the clock signal from the second state to the first state; and
an output latch, comprising:
a feed forward stage that latches data from the data node to a second data node in response to the transition of the clock signal from the second state to the first state;
a second driver stage having an input coupled to the second data node and having an output coupled to a second gain node; and
an output stage that latches data asserted on the second gain node on an output node and back to the feed forward stage to maintain data on the second data node in response to a transition of the clock cycle from the first state to the second state.

15. The flip-flop of claim 14, wherein the first driver stage is configured to increase a gain-bandwidth product of a first latch loop between the input stage and the keeper stage, and wherein the second driver stage is configured to increase a gain-bandwidth product of a second latch loop between the feed forward stage and the output stage.

16. The flip-flop of claim 14, wherein the first and second driver stages are each configured with a drive strength and a loading capacitance that reduces metastability.

17. The flip-flop of claim 14, wherein the input and output latches comprise P-channel and N-channel devices, and wherein the first and second driver stages comprise P-channel and N-channel devices having greater drive capacity and reduced loading capacitance as compared to the input, keeper, feed-forward, and output stages.

18. A method of synchronizing data, comprising:
latching data from an input node to a first data node in response to a first transition of a clock signal from a first state to a second state;
driving data on the first data node to a first gain node;
latching data on the first gain node to a first feedback node to maintain the first data node in response to a second transition of the clock signal from the second state to the first state;
latching data from the first data node to a second data node in response to the second transition of a clock signal;
driving data on the second data node to a second gain node; and
latching data on the second gain node to an output node to maintain the second data node in response to the first transition of the clock signal.

19. The method of claim 18, wherein the driving data on the first data node to a first gain node comprises increasing a gain-bandwidth product of a first latch loop between the first data node and the first feedback node, and wherein the driving data on the second data node to a second gain node comprises increasing a gain-bandwidth product of a second latch loop between the second data node and the output node.

20. The method of claim 18, wherein the driving data on the first data node to a first gain node and the driving data on the second data node to a second gain node each comprise driving with drive capacity and loading capacitance that reduces metastability.

* * * * *